(12) United States Patent
Kaneshiro et al.

(10) Patent No.: US 8,338,560 B2
(45) Date of Patent: Dec. 25, 2012

(54) POLYIMIDE FILM AND USE THEREOF

(75) Inventors: Hisayasu Kaneshiro, Uji (JP); Takashi Kikuchi, Otsu (JP)

(73) Assignee: Kaneka Corporation, Osaka (JP)

( * ) Notice: Subject to any disclaimer, the term of this patent is extended or adjusted under 35 U.S.C. 154(b) by 766 days.

(21) Appl. No.: 11/918,558

(22) PCT Filed: Apr. 25, 2006

(86) PCT No.: PCT/JP2006/308660
§ 371 (c)(1),
(2), (4) Date: Oct. 10, 2007

(87) PCT Pub. No.: WO2006/115258
PCT Pub. Date: Nov. 2, 2006

(65) Prior Publication Data
US 2008/0305316 A1    Dec. 11, 2008

(30) Foreign Application Priority Data

Apr. 25, 2005  (JP) .................................. 2005-126686

(51) Int. Cl.
C08G 73/00 (2006.01)
B32B 7/12 (2006.01)
B32B 15/08 (2006.01)
(52) U.S. Cl. ..................... 528/170; 428/349; 428/458
(58) Field of Classification Search .................. 428/458, 428/349; 528/170
See application file for complete search history.

(56) References Cited

U.S. PATENT DOCUMENTS

| | | | |
|---|---|---|---|
| 4,535,105 | A | 8/1985 | Inaike et al. |
| 5,196,500 | A | 3/1993 | Kreuz et al. |
| 5,202,412 | A | 4/1993 | Auman et al. |
| 6,277,495 | B1 * | 8/2001 | Sawasaki et al. ............. 428/458 |
| 6,335,416 | B1 | 1/2002 | Nojiri et al. |
| 6,350,844 | B1 | 2/2002 | Ono et al. |
| 2004/0097694 | A1 | 5/2004 | Fujihara et al. |
| 2006/0054262 | A1 | 3/2006 | Kikuchi et al. |

FOREIGN PATENT DOCUMENTS

| | | |
|---|---|---|
| JP | 4-207094 | 7/1992 |
| JP | 06-333994 | 12/1994 |
| JP | 07-041556 | 2/1995 |
| JP | 09-199830 | 7/1997 |
| JP | 10-036506 | 2/1998 |
| JP | 10-070157 | 3/1998 |
| JP | 10-126019 | 5/1998 |
| JP | 10-130594 | 5/1998 |
| JP | 11-335555 | 12/1999 |
| JP | 2000-063543 | 2/2000 |
| JP | 2000-159887 | 6/2000 |
| JP | 2000-297163 | 10/2000 |
| JP | 2001-072781 | 3/2001 |
| JP | 2001-315256 | 11/2001 |
| JP | 3289295 | 3/2002 |
| JP | 2002-326280 | 11/2002 |
| JP | 2002-326308 | 11/2002 |
| JP | 2002-338930 | 11/2002 |
| JP | 2004-143300 | 5/2004 |
| JP | 2004-188962 | 7/2004 |
| JP | 2004-346210 | 12/2004 |
| JP | 2005-178242 | 7/2005 |
| JP | 2005-199481 | 7/2005 |
| JP | 2005-200435 | 7/2005 |
| JP | 2002-322276 | 11/2008 |
| WO | WO00/11066 | 3/2000 |

OTHER PUBLICATIONS

English translation of PCT International Preliminary Report on Patentability issued Oct. 30, 2007 (6 pgs).
Patent Abstracts of Japan, Publication No. 2000-297163, Oct. 24, 2000, (1 pg).
Patent Abstracts of Japan, Publication No. 2001-072781, Mar. 21, 2001, (2 pgs).
Patent Abstracts of Japan, Publication No. 2000-159887, Jun. 13, 2000, (1 pg).
Patent Abstracts of Japan, Publication No. 10-126019, May 15, 1998, (1 pg).
Patent Abstracts of Japan, Publication No. 07-041556, Feb. 10, 1995, (1 pg).
Patent Abstracts of Japan, Publication No. 2005-200435, Jul. 28, 2005, (1 pg).
International Search Report, Jun. 27, 2006 (6 pgs).
Patent Abstracts of Japan, Publication No. 09-199830, Jul. 31, 1997, (1 pg).

(Continued)

*Primary Examiner* — Kevin R Kruer
(74) *Attorney, Agent, or Firm* — Kagan Binder, PLLC

(57) ABSTRACT

The present invention provides a polyimide film and its usage. The polyimide film according to the present invention does not cause dimensional change due to thermal stress. The present invention particularly relates to a polyimide film and its usage, which polyimide film has a characteristic of suppressing thermal deformation of the material in lamination of a polyimide film and a metal layer by a laminate method. The polyimide film according to the present invention has the following characteristics:

(1) an inflexion point of storage modulus ranges from 270° C. to 340° C.;
(2) tan δ, which is a value obtained by dividing a loss elastic modulus by a storage modulus, has a peak-top in a range of 320° C. to 410° C.;
(3) a storage modulus at 380° C. ranges from 0.4 GPa to 2.0 GPa; and
(4) a storage modulus α1 at the inflexion point (GPa) and a storage modulus α2 at 380° C. (GPa) satisfy: $85 \geq \{(\alpha1-\alpha2)/\alpha1\} \times 100 \geq 65$. With these characteristics, the polyimide film gives an effect of suppressing thermal deformation of the material in lamination of a polyimide film and a metal layer by a laminate method.

14 Claims, No Drawings

OTHER PUBLICATIONS

Patent Abstracts of Japan, Publication No. 2002-326308, Nov. 12, 2002, (1 pg).
Patent Abstracts of Japan, Publication No. 2002-326280, Nov. 12, 2002, (1 pg).
Abstract, JP2000-063543, 1 page.
Abstract, JP2004-143300, 1 page.
Abstract, JP2001-315256, 1 page.
Abstract, JP2002-322276, 1 page.
Abstract, JP10-130594, 1 page.
Abstract, 10-070157, 1 page.
Abstract, 10-036506, 1 page.
Abstract, 06-333994, 1 page.
Abstract, 2002-338930, 1 page.
Abstract, 11-335555, 1 page.
Machine Translation, JP2004-346210, 9 pages.
International Search Report of PCT/JP2005/016889, mailed Nov. 22, 2005, 4 pages.
English Translation of International Preliminary Report on Patentability of PCT/JP2005/016889, mailed Jun. 27, 2006, 5 pages.
English Translation of International Preliminary Report on Patentability of PCT/JP2006/314728, mailed Feb. 5, 2008, 4 pages.
Office Action in connection with U.S. Appl. No. 11/663,622, mailed Nov. 27, 2009, 16 pages.
Office Action in connection with U.S. Appl. No. 11/663,622, mailed Jun. 18, 2010, 9 pages.
Advisory Action in connection with U.S. Appl. No. 11/663,622, mailed Sep. 2, 2010, 5 pages.
Advisory Action in connection with U.S. Appl. No. 11/663,622, mailed Jan. 27, 2011, 5 pages.
Office Action in connection with U.S. Appl. No. 11/989,851, mailed Oct. 8, 2010, 13 pages.
English Translation of International Preliminary Report on Patentability of PCT/JP2005/016889, mailed Mar. 27, 2007, 5 pages.
English-language translation of JP 4-207094, 15 pgs.
English-language machine translation of JP2005-199481, 19 pgs.
English-language machine translation of JP2005-178242, 19 pgs.

* cited by examiner

POLYIMIDE FILM AND USE THEREOF

This application is a U.S. National Stage Application of International Application PCT/JP2006/308660 filed on Apr. 25, 2006 which designates the United States of America, and claims priority to Japanese application 2005-126686, filed Apr. 25, 2005.

TECHNICAL FIELD

The present invention relates to a polyimide film and its usage, particularly to a polyimide film not causing dimensional change in the fabrication process of a flexible metal clad laminate, and the usage of the polyimide film. The present invention further provides a polyimide film which can be used to produce a flexible metal clad laminate ensuring superior dimensional stability by adhering with a metal foil adhesion layer by a thermal laminate method.

BACKGROUND ART

In recent years, small, light-weighted and highly-dense electronic-products have been developed, and along with this demand for various types of printed-circuit board, particularly for a flexible printed-circuit board (may be referred to as "FPC" hereinafter), has been increasing. The FPC includes an insulative film and a circuit of metal foil formed thereon.

The flexible laminate such as the FPC is constituted of a flexible metal clad laminate. A typical flexible metal clad laminate is formed of an insulative material, and includes a flexible insulative film as a base substrate and a metal foil which is thermally pressed onto the surface of the base substrate via an adhesive material to be bonded thereto. A polyimide film is suitably used for the insulative film.

An epoxy or acrylic thermosetting adhesive is typically used as the adhesive material.

The flexible wire board using the thermosetting adhesive is made up of three layers: a base substrate, an adhesive material, and a metal foil, and is therefore also called a "three-layer FPC".

The thermosetting adhesive used for the three-layer FPC has an advantage such that it ensures an adhesive property under a relatively low temperature. However, the three-layer FPC using the thermosetting adhesive is assumed to soon have a difficulty in meeting the increasing demand for a FPC with various characteristics such as heat-resistant, flexibility, or electric reliability at the same time.

In consideration of this demand, a recent technology has suggested a FPC in which a metal layer is directly formed on an insulative film, or includes thermoplastic polyimide as an adhesion layer. Because of the direct provision of metal layer on the insulative substrate, this FPC is called a two-layer FPC. The two-layer FPC has a superior characteristic than the three-layer FPC, and its property is sufficient to meet the requirement for the various characteristics. The demand for the two-layer FPC is therefore expected to increase in the future.

The flexible metal clad laminate used for a two-layer FPC is produced, for example, by (1) a casting method which casts or applies a polyamic acid, which is a precursor of polyimide, onto a metal foil, and imidizing the polyamic acid, (2) a metallization method which directly forms a metal layer on a polyimide film by sputtering or plating, or (3) a laminate method which bonds a polyimide film with a metal foil via thermoplastic polyimide.

Among these technologies, the laminate method can deal with a wider thickness range of metal foils than the casting method. Also, the device cost for the laminate method is lower than the metallization method. A typical apparatus used for the laminate method is a thermal roll laminate apparatus which carries out sequential laminate processes by unrolling a material roll, or a double belting press apparatus. Among them, the thermal roll laminate method using a thermal roll laminate apparatus is preferable in terms of productivity.

In recent small and light-weighted electronic devices, wires on the base substrate have become miniaturized, and the components mounted to the devices are also reduced in dimension to allow themselves to be disposed at a high density. Therefore, a significant change in dimension after the wire formation causes shifting of the components from the designed mounting position. This may cause inadequate conduction between the components and the base substrate.

The conventional laminate method for fabricating a three-layer FPC uses a thermosetting resin as the adhesion layer, and therefore the laminate temperature is less than 200° C. (see Patent Document 1). In contrast, the two-layer FPC includes thermoplastic polyimide as the adhesion layer, and therefore needs to be subjected to a heating process of 200° C. or greater, or even almost 400° C. in some cases. Therefore, residual strain remains on the flexible metal clad laminate resulted from the laminate process, which results in a dimensional change at the time of forming wires by etching, or at the time of reflow soldering for mounting components.

Particularly, the laminate method often has a process of casting or applying a polyamic acid, which is a precursor of thermoplastic polyimide, in forming an adhesion layer including thermoplastic polyimide on a polyimide film. In this case, since imidization is carried out by sequentially heating the casted or applied polyamic acid, and bonding of the metal foil is also carried out by sequential application of heat and pressure, the material is often is exposed to tension and heat. Therefore, a thermal stress in the MD direction and that in the TD direction differ. More specifically, a pulling force is applied in the MD direction under tension, and a contracting force is applied in the TD direction. As a result, in the removal of the metal foil from the flexible laminate by etching, and in the heating through the reflow soldering, the deformation is released. This causes a contraction in the MD direction, and an expansion in the TD direction.

Particularly, in recent years, a required solder resistance under the moisture absorption condition tends to be higher due to the usage of lead-free solders, and along with this the Tg (glass transition temperature) of the adhesion layer is also increasing. This results in an increase of the required temperature for the laminate process. Therefore, the thermal stress becomes further greater, more easily causing a dimensional change. This raises a necessity of material design which can ease the thermal stress.

In view of this problem, several techniques have been disclosed. They suggest suppression of the dimensional change by way of control of laminate pressure or tension control of the adhesive film (see Patent Document 2 or 3).

To be more specific, the Patent Document 2 discloses formation of a FPC which includes the steps of forming a metal foil and a heat-resistant adhesive film by heat and pressure by placing a protection material between at least one pair of press rolls; cooling the resulting lamination and the protection material which are in contact with light pressure; and separating the protection material from the lamination. This method has a smaller rate of dimensional change.

According to Patent Document 3, an adhesive film is dried in advance in the FPC production process to remove internal moisture, and the resulting adhesive film is subjected to thermal laminate as such. This manner prevents generation of irregular patterns on the surface of the lamination.

However, in the techniques of Patent Document 2 and Patent Document 3 which solve the dimensional change by changing the thermal laminate conditions, assurance of dimensional accuracy is limited. Therefore, there has been a demand for a dimensional change prevention technology ensuring high dimensional accuracy.

Further, the thickness of insulative layer used for the existing two-layer FPC is typically 25 μm (1 mil), but there also is a new demand for so-called a "half-mil" having a 12-15 μm thick insulative layer, in terms of further reduction in mounting space of base substrate, or the problem of spring back.

Compared with a 1-mil product, a half-mil product has a thinner adhesive film, which is more susceptible to the thermal stress on the laminate process, and therefore has a greater difficulty in suppressing dimensional change.

Under such a circumstance, there is a demand for a new technology for effectively suppressing a dimensional change of a polyimide film due to thermal stress.

[Patent Document 1] Japanese Unexamined Patent Publication "Tokukaihei 9-199830 (published on Jul. 31, 1997)"
[Patent Document 2] Japanese Unexamined Patent Publication "Tokukai 2002-326308 (published on Nov. 12, 2002)"
[Patent Document 3] Japanese Unexamined Patent Publication "Tokukai 2002-326280 (published on Nov. 12, 2002)"

DISCLOSURE OF INVENTION

The present invention is made in view of the foregoing problems, and an object is to provide a polyimide film which can suppress a dimensional change due to thermal stress, and usage thereof. The present invention particularly provides a polyimide film which can suppress a dimensional change in the fabrication process of a flexible metal clad laminate and its usage, and a polyimide film which can suppress thermal deformation of a material in a laminate method.

The inventors of the present invention had carried out intensive studies to solve the foregoing problems, and found in the unique way that a polyimide film with a specific range of storage modulus ensures prevention of dimensional change in the fabrication process of a flexible copper clad laminate constituted of the polyimide film. The inventors thus completed the present invention. The present invention is characterized by the following features (1) to (19).

(1) A polyimide film according to the present invention is a polyimide film produced by imidizing a polyamic acid produced by reacting aromatic diamine containing 4,4'-diaminodiphenylether, and aromatic acid dianhydride, said polyimide film satisfies all of the following conditions (A) to (D), (A) an inflexion point of storage modulus ranges from 270° C. to 340° C.;

(B) tan δ, which is a value obtained by dividing a loss elastic modulus by a storage modulus, has a peak-top in a range of 320° C. to 410° C.;

(C) a storage modulus at 380° C. ranges from 0.4 GPa to 2.0 GPa; and (D) a storage modulus α1 at the inflexion point (GPa) and a storage modulus α2 at 380° C. (GPa) satisfy: $85 \geq \{(\alpha1 - \alpha2)/\alpha1\} \times 100 \geq 65$.

(2) The polyimide film is produced by imidization of a polyamic acid solution, which is prepared by the following steps (a) to (c), (a) reacting aromatic acid dianhydride, and an excess molar quantity of aromatic diamine compound in an organic polar solvent, so as to produce a prepolymer having an amino group at each terminus;

(b) subsequently adding an aromatic diamine compound into the reaction solution; and (c) adding aromatic acid dianhydride so that molar amounts of the aromatic acid dianhydride and the aromatic diamine in a whole process become substantially equal.

(3) The polyimide film is produced using 4,4'-diaminodiphenylether in an amount of not less than 10 mol % with respect to an entire diamine component.

(4) The polyimide film is arranged so that a tensile modulus of the polyimide film is not less than 6.0 GPa.

(5) The polyimide film is arranged so that a moisture-absorption expansion coefficient of the polyimide film after the polyimide is kept at 50° C., 40% R.H. for three hours and 80% R.H. for another three hours is not more than 13 ppm/% R.H.

(6) The polyimide film is arranged so that a linear expansion coefficient of the polyimide film at 100° C. to 200° C. is not more than 15 ppm/° C.

(7) An adhesive film according to the present invention is formed by providing an adhesion layer containing thermoplastic polyimide at least on one side of the polyimide film.

(8) The adhesive film is arranged so that a glass transition temperature (Tg) of the thermoplastic polyimide is not less than 230° C.

(9) The adhesive film is arranged so that a thickness of the adhesive film is not more than 15 μm.

(10) A flexible metal clad laminate according to the present invention is formed by bonding the adhesive film with a metal foil.

(11) The flexible metal clad laminate is arranged so that the flexible metal clad laminate is formed by bonding the adhesive film with a metal foil using a thermal roll laminate apparatus having at least a single pair of metal rolls.

(12) The flexible metal clad laminate is arranged so that the flexible metal clad laminate is formed by a laminate process in which the adhesive film is bonded with a metal foil by the thermal roll laminate apparatus having at least a single pair of metal rolls, using a protection material provided between the metal foil and the rolls, and separating the protection material "after a resulting lamination" is cooled, the protection material being made of non-thermoplastic polyimide or thermoplastic polyimide whose glass transition temperature (Tg) is at least 50° C. higher than a laminate temperature.

(13) The flexible metal clad laminate is arranged so that, before the protection material is removed after the laminate process, the lamination in which the protection material and the flexible metal clad laminate are bonded together is brought into contact with a heating roll for 0.1 to 5 seconds, and the protection material is removed after the lamination is cooled.

(14) The flexible metal clad laminate is arranged so that a dimensional change ratio of the flexible metal clad laminate before and after 30 minutes heating at 250° C. after the removal of metal foil ranges from −0.04 to +0.04% both in a MD direction and in a TD direction.

(15) The flexible metal clad laminate is arranged so that the adhesive film has a thickness of not more than 15 μm, and the dimensional change ratio of the flexible metal clad laminate before and after 30 minutes heating at 250° C. after the removal of metal foil ranges from −0.05 to +0.05% both in a MD direction and in a TD direction.

In the polyimide film according to the present invention, the storage modulus has an inflexion point to reduce thermal stress on lamination. The inflexion point is also specified.

With this arrangement, the flexible metal clad laminate formed by bonding the adhesive film containing the polyimide film as the core layer with a metal foil by a laminate method provides an effect of securely suppressing a dimensional change. More specifically, the flexible metal clad laminate is arranged so that a dimensional change ratio of the flexible metal clad laminate before and after 30 minutes heating at 250° C. after the removal of metal foil ranges from −0.04 to +0.04% both in a MD direction and in a TD direction. This effect becomes particularly significant when the adhesive film has a thickness of not more than 15 μm. Therefore, the present invention is applicable to a FPC or the like in which fine wires are formed, without causing displacement or the like.

BEST MODE FOR CARRYING OUT THE INVENTION

The following explains one embodiment of the present invention in detail. The present invention is however not limited to the embodiment below. The following explanation deals with the details of "polyimide film", "production method of polyimide film", "adhesive film", "flexible metal clad laminate", "production method of flexible metal clad laminate", and "usage of the present invention" in this order.

<I. Polyimide Film of the Present Invention>

The inventors of the present invention had carried out intensive studies, and found that a polyimide film having all of the following four physicochemical properties can effectively suppress a dimensional change in manufacturing of flexible metal clad laminate. Adhesiveness and solder heat-resistant which are usually decreased by an arrangement for suppressing the dimensional change, but the polyimide film according to the present invention can improve these conventionally-incompatible properties while suppressing the dimensional change. More specifically, the inventors of the present invention found that the polyimide film of the present invention can suppress the dimensional change, and also is superior in adhesiveness and solder heat-resistant. Further, this polyimide film having all of the four physicochemical properties is totally new, and has not been known conventionally. The following describes the four physicochemical properties.

(1. Inflexion Point of Storage Modulus)

To ease thermal stress in bonding a metal foil by the laminate method, an inflexion point of storage modulus of the polyimide film according to the present invention preferably ranges from 270 to 340° C., more preferably from 280 to 330° C. If the inflexion point of the storage modulus is less than the foregoing range, softening of the core layer starts at a temperature at which the dimensional change of the flexible metal clad laminate is evaluated after heating (a temperature of 250° C. is often used in the field of two-layer FPC). This may increase the dimensional change. Meanwhile, if the inflexion point of the storage modulus is more than the foregoing range, softening of the core layer starts at a higher temperature. Since this makes the ease of thermal stress in the thermal laminate insufficient, the dimensional change may increase.

(2. Peak-Top of Tan δ)

In the present specification, "tan δ" designates a value obtained by dividing a loss elastic modulus by a storage modulus. The polyimide film according to the present invention preferably has a peak-top of tan δ ranging from 320° C. to 410° C., more preferably 330° C. to 400° C.

If the peak-top of tan δ is less than the foregoing range, the temperature at which the tan δ increases becomes around or less than 250° C. at which the dimensional change of the heated flexible metal clad laminate is evaluated. In this case, the core layer may start to soften at a temperature at the time where the dimensional change is measured, and the dimensional change may increase.

Meanwhile, if the peak-top of tan δ is more than the foregoing range, an excessively high temperature is required to soften the core layer to the level of easing the deformation, and therefore the thermal stress cannot be eased by the existing laminate apparatus. This may increase the dimensional change. If the peak-top of tan δ falls outside the foregoing range, the dimensional change may increase, as in the case of the inflexion point of storage modulus.

(3. Storage Modulus at 380° C.)

The inventors of the present invention had carried out intensive studies, and found that, in order to also ensure solder heat-resistance, the glass transition temperature of the adhesion layer preferably ranges from 230° C. to 280° C., more preferably from 240° C. to 280° C. The inventors of the present invention also found that, in this case, the laminate temperature of about 380° C. is required for a laminate process to ensure desirable productivity. Accordingly, it is very important to control storage modulus at 380° C.

For a polyimide film according to the present invention, the storage modulus at 380° C. preferably ranges from 0.4 to 2.0 GPa, more preferably from 0.6 to 1.8 GPa, particularly preferably from 0.7 to 1.6 GPa.

If the storage modulus at 380° C. is less than the foregoing range, the self-supporting property of the film cannot be maintained at the time of imidization or thermal laminate. This can decrease productivity of film or appearance of the resulting flexible metal clad laminate. Meanwhile, if the storage modulus at 380° C. is more than the foregoing range, the core layer will not be fully softened. Since this makes the ease of thermal stress in the thermal laminate insufficient, the dimensional change will further increase.

(4. Relationship Between Storage Modulus α1 at Inflexion Point and Storage Modulus α2 at 380° C.)

The inventors of the present invention studied the relationship between storage modulus α1 at inflexion point and storage modulus α2 at 380° C., and found that the value of the (α1−α2)/α1 is important in suppressing the dimensional change in the process of manufacturing a flexible metal clad laminate.

Specifically, the polyimide film according to the present invention preferably satisfies $85 \geq \{(\alpha1-\alpha2)/\alpha1\} \times 100 \geq 65$.

If the value of "$\{(\alpha1-\alpha2)/\alpha1\} \times 100$" falls below the foregoing range, the degree of decrease in storage modulus is small. Since this makes the ease of thermal stress in the thermal laminate insufficient, the dimensional change of the resulting flexible metal clad laminate will further increase. Meanwhile, if the value of "$\{(\alpha1-\alpha2)/\alpha1\} \times 100$" is more than the foregoing range, the self-supporting property of the film cannot be maintained. This can decrease productivity of film or appearance of the resulting flexible metal clad laminate.

In addition to the foregoing four physicochemical properties, the polyimide film according to the present invention preferably has the following physicochemical properties.

(5. Tensile Modulus)

In the polyimide film according to the present invention, the types and the compounding ratios of the aromatic acid dianhydride and aromatic diamine are specified in the following section of <Production method for polyimide film> so as to ensure a desirable glass transition temperature, and a storage modulus at a high temperature range. However, considering that the adhesive film, which is an assumed usage of the polyimide film, is processed by a thermal laminate method, the tensile modulus is preferably equal to or greater than 6.0 GPa, more preferably equal to or greater than 6.5 GPa.

If the tensile modulus is less than the foregoing value, the influence of the tension becomes more significant. This causes residual stress on the flexible metal clad laminate, which becomes a cause of dimensional change. Further, if the film thickness is small, the film will have a low stiffness, and may cause some kind of defect in carriage or handling.

The upper limit of the tensile modulus is preferably not more than 10 GPa, more preferably not more than 9.0 GPa. If the tensile modulus is more than the foregoing value, the strength becomes excessively large, which may cause a defect in handling.

(6. Moisture-Absorption Expansion Coefficient)

Further, in consideration of influence to the dimensional change, a moisture-absorption expansion coefficient of the polyimide film after kept at 50° C., 40% R.H. for three hours and 80% R.H. for another three hours is preferably not more than 13 ppm/% R.H., more preferably not more than 11 ppm/% R.H. If the moisture-absorption expansion coefficient is greater than the foregoing value, the dimensional change becomes more dependent on environment. This may come out as a defect when the polyimide film is used as a FPC.

(7. Linear Expansion Coefficient)

Further, also in consideration of influence on the dimensional change, a linear expansion coefficient of the polyimide film at 100° C. to 200° C. is preferably not more than 15 ppm/° C., more preferably not more than 13 ppm/° C.

If the linear expansion coefficient is greater than the foregoing value, the linear expansion coefficient as the adhesive film becomes excessively large, and the difference with the linear expansion coefficient of the metal foil becomes large. This can be a cause of the dimensional change.

Meanwhile, also in the case where the linear expansion coefficient is excessively small, the difference with the linear expansion coefficient of the metal foil becomes large. Therefore, the lower limit of linear expansion coefficient is preferably set to 5 ppm/° C., more preferably to 6 ppm/° C. With a linear expansion coefficient ranging from 5 to 15 ppm/° C., or more preferably 6 to 13 ppm/° C., it becomes possible to more easily bring a linear expansion coefficient of the adhesive film closer to that of the metal foil.

<II. Production Method for the Polyimide Film According to the Present Invention>

The following describes one embodiment of production method for the polyimide film according to the present invention. The present invention is however not limited to this method, and the condition in film formation or heating may be varied depending on the type of polyamic acid or the film thickness.

A suitable production method for the polyimide film according to the present invention includes the steps of: reacting aromatic diamine with aromatic acid dianhydride in an organic solvent so as to obtain a polyamic acid solution (hereinafter also referred to as a "polyamic acid solution preparation step"); and imidizing the polyamic acid solution to form a polyimide film (hereinafter also referred to as an "imidization step").

The following more specifically describes each step.

(1. Polyamic Acid Solution Preparation Step)

The polyimide film according to the present invention is obtained by a polyamic acid solution, which is a precursor of polyimide. A polyamic acid solution is typically prepared by dissolving substantially equimolar amounts of aromatic diamine (hereinafter also referred to as an "aromatic diamine compound") and aromatic acid dianhydride into an organic solvent, and stirring the resulting polyamic acid organic solvent solution at a specific temperature until the aromatic acid dianhydride and the aromatic diamine are fully polymerized. The polyamic acid solution thus prepared usually has a concentration of 5 to 35 wt %, more preferably 10 to 30 wt %. A polyamic acid solution with a concentration in this range ensures appropriate molecular amount and solution viscosity.

The property of the polyimide film according to the present invention can be controlled not only by controlling the structures of aromatic diamine and aromatic acid dianhydride serving as material monomers, but also by controlling the order of adding the monomers. That is, to obtain the polyimide film according to the present invention, it is preferable to imidize a polyamic acid solution produced through the following steps (a) to (c).

(a) Step of reacting, in an organic polar solvent, aromatic acid dianhydride and an aromatic diamine compound in excess of aromatic acid dianhydride in molar quantity so as to obtain a prepolymer having an amino group at each terminus.

(b) Step of subsequently adding an aromatic diamine compound into the reaction solution.

(c) Step of adding extra aromatic acid dianhydride so that the molar amounts of the aromatic acid dianhydride and the aromatic diamine in the whole process become substantially equal.

Examples of the aromatic diamine used as a material monomer of the polyimide film according to the present invention include 4,4'-diaminodiphenylpropane, 4,4'-diaminodiphenylmethane, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenylsulfide, 3,3'-diaminodiphenylsulfone, 4,4'-diaminodiphenylsulfone, 4,4'-diaminodiphenylether, 3,3'-diaminodiphenylether, 3,4'-diaminodiphenylether, 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene(p-phenylenediamine), 1,3-diaminobenzene, 1,2-diaminobenzene, bis{4-(4-aminophenoxy)phenyl}sulfone, bis{4-(3-aminophenoxy)phenyl}sulfone, 4,4'-bis(4-aminophenoxy)biphenyl, 4,4'-bis(3-aminophenoxy)biphenyl, 2,2-bis{4-(4-aminophenoxy)phenyl}propane (may also be referred to as "BAPP", hereinafter), 1,3-bis(3-aminophenoxy)benzene, 1,3-bis(3-aminophenoxy)benzene, 1,3-bis(4-aminophenoxy)benzene, 1,3-bis(3-aminophenoxy)benzene, 3,3'-diaminobenzophenone, 4,4'-diaminobenzophenone, and stimulants of those.

Preferably, the step (a) produces a prepolymer for forming a block component derived from thermoplastic polyimide. To obtain the prepolymer for forming a block component derived from thermoplastic polyimide, a reaction between acid dianhydride and diamine having flexibility is preferred.

In the present invention, "block component derived from thermoplastic polyimide" designates a prepolymer obtained by reaction of an aromatic diamine compound with an aromatic tetracarboxylic acid dianhydride, which prepolymer ensures the following characteristic when it forms a polyimide resin film (hereinafter referred to as a "polyimide film made of thermoplastic polyimide block component", for ease of explanation) through equimolar reaction of the aromatic diamine compound and the aromatic tetracarboxylic acid dianhydride. That is, the resulting polyimide film is softened and transformed in shape by a heating process in which the film is fixed to a metal frame and heated for one minute at 400° C. The polyimide film made of thermoplastic polyimide block component may be produced by any publicly-known method as long as maximum heat temperature is set to 300° C., and calcination time is set to 15 minutes. More specifically, by subjecting the polyimide produced through equimolar reaction of aromatic diamine compound and aromatic acid anhydride component used in the step (a) as to whether the polyimide is melted by the foregoing temperature or transformed in shape, suitable aromatic diamine compound and aromatic acid dianhydride component can be found.

The use of such a prepolymer facilitates the reaction processes in the step (b) and the step (c), and the resulting polyamic acid includes thermoplastic portions which are studded about in the molecular chain. By selecting appropriate aromatic diamine compound and aromatic acid dianhydride component for the step (b) and the step (c), and by so carrying out polymerization of polyamic acid as to finally produce non-thermoplastic polyimide, the polyimide film to be produced by imidization of this polyamic acid will include thermoplastic portions, and therefore will have an inflexion point of storage modulus in a high-temperature region. Meanwhile, since most part of the molecular chain is non-thermoplastic, the defects, such as the difficulty in film formation by the decrease in storage modulus in the high-temperature region, or the decrease in appearance by the heating in forming the adhesive film, can be prevented by controlling the ratio of the thermoplastic portion to the non-thermoplastic portion.

In the present invention, "diamine having flexibility" designates diamine having a flexible structure, such as an ether group, a sulfone group, a ketene group, or a sulfide group. The "diamine having flexibility" more preferably expressed by the following General Formula (1).

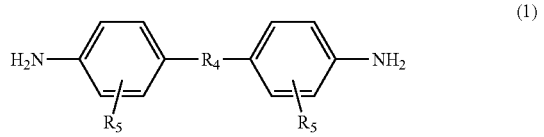
(1)

where $R_4$ expresses a group selected from a group consisting of divalent organic groups denoted by:

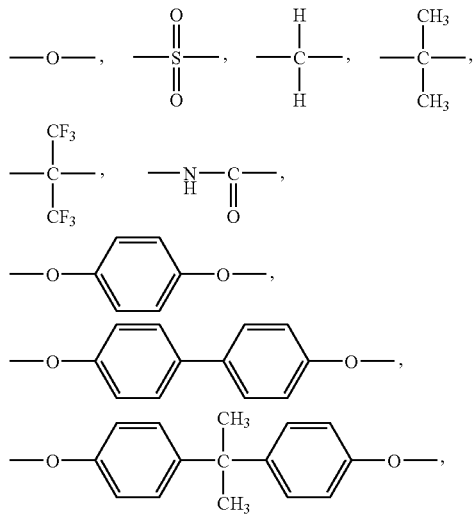

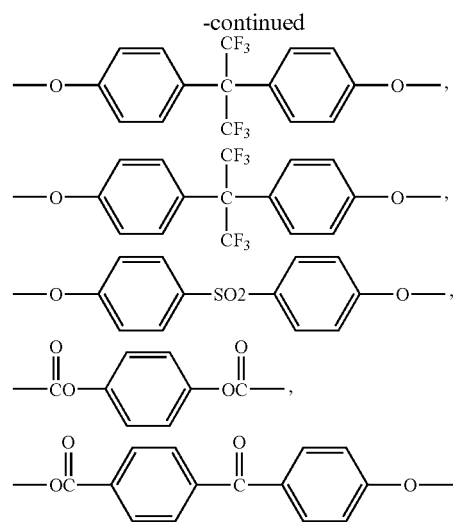

and $R_5$ expresses the same or a different group selected from a group consisting of H—, $CH_3$—, —OH, —$CF_3$, —$SO_4$, —COOH, —CO—$NH_2$, Cl—, Br—, F—, and $CH_3O$—. Further, the use of the aromatic diamine component in the step (b), which is a diamine having a rigid structure, provides a desired result of production of a non-thermoplastic film. In the present invention, the "diamine having a rigid structure" can be any diamine having a rigid structure with an inflexible main chain between the two $NH_2$ groups. Apart from this characteristic, the structure is not particularly limited.

An example of the diamine having a rigid structure is expressed by the General Formula (2).

$$NH_2—R_2—NH_2 \qquad (2)$$

where $R_2$ expresses a group selected from a group consisting of divalent aromatic groups denoted by

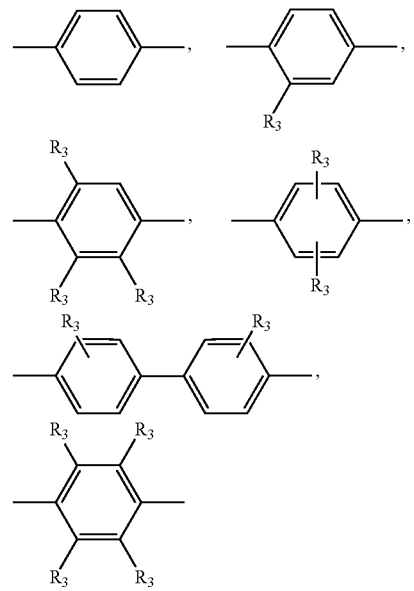

and $R_3$ expresses the same or a different group selected from a group consisting of H—, $CH_3$—, —OH, —$CF_3$, —$SO_4$, —COOH, —CO—$NH_2$, Cl—, Br—, F—, and $CH_3O$—.

A preferable usage ratio of the diamine having a rigid structure to the diamine having a flexible structure (diamine having flexibility) is 80:20 to 20:80, more preferably 70:30 to 30:70, particularly preferably 60:40 to 40:60 in molar proportion.

A usage ratio of the diamine having a rigid structure more than the foregoing range may cause an unwanted effect, such as: (1) the glass transition temperature of the film becomes excessively high, (2) the storage modulus in the high-temperature region hardly decrease, or (3) the linear expansion coefficient becomes excessively small. Meanwhile, a usage ratio of the diamine having a rigid structure less than the foregoing range may cause defects totally contrary to the problems (1) to (3).

Plural kinds of the diamine having a flexible structure and the diamine having a rigid structure may be combined, but 4,4'-diaminodiphenylether is particularly preferable for the diamine having a flexible structure in the formation of the polyimide film according to the present invention.

The 4,4'-diaminodiphenylether has only one ether bond, i.e. only one flexion portion, it has an intermediate property between the diamine having a flexible structure and the diamine having a rigid structure. More specifically, it gives the effect of decreasing the storage modulus, but it does not significantly increase the linear expansion coefficient. Therefore, by using the 4,4'-diaminodiphenylether having only one ether bond with diamine having many flexion portions, such as 1,3-bis(3-aminophenoxy)benzene, or bis{4-(4-aminophenoxy)phenyl}propane, it is possible to easily ensure the property balance of the resulting polyimide film.

Further, by using the 4,4'-diaminodiphenylether as the material of the polyimide film, productivity of film can be further increased while maintaining the foregoing superior film characteristic.

The usage amount of the 4,4'-diaminodiphenylether is preferably not less than 10 mol %, more preferably not less than 15 mol % with respect to the entire diamine component.

If the amount is less than this range, the foregoing effect may not be fully ensured. The upper limit of the usage amount is preferably not more than 50 mmol %, more preferably not more than 40 mol %. If the amount is more than this range, the tensile modulus of the resulting polyimide film may decrease.

Examples of the aromatic acid dianhydride used as a material monomer of the polyimide film according to the present invention include pyromellitic acid dianhydride, 2,3,6,7-naphthalene tetracarboxylic acid dianhydride, 3,3',4,4'-biphenyltetracarboxylic acid dianhydride, 1,2,5,6-naphthalene tetracarboxylic acid dianhydride, 2,2',3,3'-biphenyl tetracarboxylic acid dianhydride, 3,3',4,4'-benzophenone tetracarboxylic acid dianhydride, 2,2',3,3'-benzophenone tetracarboxylic acid dianhydride, 4,4'-oxyphthalic acid dianhydride, 3,4'-oxyphthalic acid dianhydride, 2,2-bis(3,4-dicarboxyphenyl)propane dianhydride, 3,4,9,10-perylene tetracarboxylic acid dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic acid dianhydride, bis(3,4-dicarboxyphenyl) sulfone dianhydride, p-phenylene bis(trimellitic acid monoester acid anhydride), ethylenebis(trimellitic acid monoester acid anhydride), bisphenol A bis(trimellitic acid monoester acid anhydride), and stimulants of those. Each of these compounds may be used solely, or as a mixture at an arbitrary ratio.

As with the diamine, the materials of the acid dianhydride is preferably divided into (i) an acid dianhydride having a flexible structure and (ii) an acid dianhydride having a rigid structure, which are used in the step (a) and in the step (c), respectively.

Preferable examples of the aromatic acid dianhydride used in the step (a) include a benzophenone tetracarboxylic acid dianhydride group, a oxyphthalic acid dianhydrides group, and a biphenyl tetracarboxylic acid dianhydride group. Further, one of preferable examples of the aromatic acid dianhydride used in the step (c) is a pyromellitic acid dianhydride.

Each usage amount of the benzophenone tetracarboxylic acid dianhydride group, the oxyphthalic acid dianhydride group, and the biphenyl tetracarboxylic acid dianhydride group is preferably 10 to 50 mol %, more preferably 15 to 45 mol %, particularly preferably 20 to 40 mol % with respect to the entire acid dianhydride, more specifically, the total acid dianhydride used in the step (a) to the step (c).

If the usage amount is less than the foregoing range, that is, if the flexible structure of the polyimide film derives only from the diamine having a flexible structure, the glass transition temperature of the resulting polyimide film becomes excessively high, or the storage modulus of the high-temperature region does not sufficiently decrease. Meanwhile, if the usage amount is more than the foregoing range, the glass transition temperature becomes excessively low, or the storage modulus in the high-temperature region excessively decrease, which may cause a difficulty in the film formation.

Further, in the case of using a pyromellitic acid dianhydride, a preferable usage amount is 40 to 100 mol %, more preferably 50 to 90 mol %, particularly preferably 60 to 80 mol % with respect to the entire acid dianhydride, more specifically, the total acid dianhydride used in the step (a) to the step (c). With the use of this range of pyromellitic acid dianhydride, the glass transition temperature and the storage modulus in the high-temperature region of the resulting polyimide film will fall within appropriate ranges for usage or film formation.

The solvent for synthesizing the polyamic acid solution is not particularly limited but any solvent for dissolving polyamic acid can be used. An amide-type solvent is however particularly preferable. Examples of the solvent include N,N-dimethylformamide (may also be referred to as "DMF"), N,N-dimethylacetamide, and N-methyl-2-pyrrolidone. N,N-dimethylformamide and N,N-dimethylacetamide are particularly preferable.

The physicochemical properties of the polyimide film according to the present invention, which are the explained in the section of <I. Polyimide film> above, such as the tensile modulus, moisture-absorption expansion ratio, or linear expansion ratio, preferably meet the foregoing ranges. These physicochemical properties are adjustable by changing the type and mixture ratio of the diamine and the acid dianhydride.

For example, the tensile modulus increases by increasing the ratio of the diamine having a rigid structure or the acid dianhydride, and decreases by decreasing the ratio.

The moisture-absorption expansion coefficient tends to increase with an increase of the ratio of the polar group such as an ether group and a carbonyl group in the polyimide molecular chain. Further, the moisture-absorption expansion coefficient also tends to increase by the use of diamine component, or an acid dianhydride component of low molecular weight (the number of imide groups per unit molecular weight is large). Therefore, the moisture-absorption expansion coefficient is adjustable by controlling the usage ratio of the flexible structure component, and by selecting an appropriate monomer structure (molecular weight).

Further, as described above, the linear expansion coefficient of the polyimide film may be controlled by changing a mixture ratio of the flexible structure component to the rigid structure component.

Further, in the foregoing "polyamic acid solution preparation step", some fillers may be added to improve the characteristics of the film, such as sliding property, heat conduction property, electric conduction, corona resistance, or loop stiffness. The fillers to be added are not particularly limited. Preferable examples of the fillers include silica, titanium oxide, alumina, silicon nitride, boron nitride, calcium hydrogen phosphate, calcium phosphate, and mica.

The particle diameter of each filler is not particularly limited. The particle diameter is determined according to the film characteristic to be modified and the type of the filler to be added. Typically, an average diameter is 0.05 to 100 µm, preferably 0.1 to 75 µm, further preferably 0.1 to 50 µm, particularly preferably 0.1 to 25 µm.

If the particle diameter is less than this range, it becomes more difficult to ensure the property modification effect. Meanwhile, if the particle diameter is greater than the range, the surface property may greatly deteriorate, or the mechanical characteristic may greatly decrease.

Further, the number of added fillers is not particularly limited, and may be determined according to the film characteristic to be modified or the particle diameter of the filler.

Generally, the number of the fillers to be added is 0.01 to 100 parts by weight, preferably 0.01 to 90 parts by weight, further preferably 0.02 to 80 parts by weight with respect to 100 parts by weight of polyimide.

If the number of added fillers falls below this range, the property modification effect given by the fillers becomes less significant. If the number of added fillers falls above this range, the mechanical characteristic of the film may greatly deteriorate. The method of adding fillers is not particularly limited, and any publicly-known methods can be adopted. One example is shown below.

(1) A method of adding fillers into a polymerization reaction solution before or during polymerization
(2) A method of mixing/kneading fillers by a three-roll or the like after polymerization.
(3) A method of preparing a solution containing dispersed fillers and mixing the solution with a polyamic acid organic solvent solution.

Among these methods, the method (3), particularly a method of adding and mixing the dispersion solution immediately before the film formation, is preferable as it causes the least filler contamination in the manufacturing line. In preparation of the solution containing dispersed fillers, it is preferable to use the same solvent as that of the polyamic acid polymerization solvent. Further, to ensure sufficient dispersion of fillers, and to maintain the proper dispersion, a dispersion agent and a thickening agent or the like may be used to an extent not affecting the film property.

(2. Imidization Step)

Any conventional methods can be used for the method of imidizing the obtained polyamic acid solution, and the method of producing the polyimide film. For example, thermal imidization method and chemical imidization method can be used. Thermal imidization method causes imidization reaction only by heating without using a dehydration ring-closuring agent or the like. On the other hand, the chemical imidization method adds a chemical conversion agent and/or an imidization catalyst to the polyamic acid solution so as to facilitate imidization.

This "chemical conversion agent" designates a dehydration ring-closuring agent affecting the polyamic acid. The examples of chemical conversion agent include aliphatic acid anhydride, aromatic acid anhydride, N,N'-dialkyl carbodiimide, lower aliphatic halogenide, lower fatty acid anhydride halogenide, arylphosphonic acid dihalogenide, thionylhalogenide, and mixtures of two or more of them. Among these, aliphatic acid anhydride such as acetic anhydride, propionic anhydride, or butyric anhydride and a mixture of two or more of them is particularly preferable in terms of ready availability and cost.

Further, "imidization catalyst" designates a component serving to facilitate an anhydride ring-closuring effect on the polyamic acid, such as aliphatic tertiary amine, aromatic tertiary amine, or heterocyclic tertiary amine. Among these, a catalyst selected from a heterocyclic tertiary amine group is particularly preferable in terms of reactivity. For example, quinoline, isoquinoline, β-picoline, and pyridine are preferable.

The film can be formed both by the thermal imidization method and the chemical imidization method. The chemical imidization method however more easily produce a polyimide film with suitable characteristic for the present invention.

In the case of performing the imidization step by the chemical imidization method, the imidization step preferably includes the steps of (i) casting a film-forming dope containing the polyamic acid solution onto a supporting base, heating the dope on the supporting base, and separating the resulting gel film from the supporting base (this step is also referred to as a "gel film creating step" hereinafter); and (ii) further heating the gel film to imidize the remaining amic acid, and drying the film (this step is also referred to as a "calcination step" hereinafter).

The following more specifically explain these steps.

(2-1. Gel Film Creating Step)

In the gel film creating step, the chemical conversion agent and/or the imidization catalyst is mixed in a polyamic acid solution at a low temperature to produce a film-forming dope.

The chemical conversion agent and imidization catalyst is not particularly limited, and can be selected from the compounds listed above. Further, in the gel film creating step, the film-forming dope may be obtained by mixing a curing agent containing a chemical conversion agent and an imidization catalyst with the polyamic acid solution.

The amount of the added chemical conversion agent is preferably in a range of 0.5 to 5 mol, more preferably in a range of 1.0 to 4 mol with respect to 1 mol amic acid unit in the polyamic acid.

Further, the amount of added imidization catalyst is preferably in a range of 0.05 to 3 mol, more preferably in a range of 0.2 to 2 mol with respect to 1 mol amic acid unit in the polyamic acid.

If the amounts of added chemical conversion agent and imidization catalyst fall below the foregoing ranges, the chemical imidization becomes insufficient, which may cause breakage during the calcination, or a decrease in mechanical strength. However, if their amounts are excessive i.e., if the amounts fall above the foregoing range, imidization proceeds too quickly, causing a difficulty in casting it into a film shape.

In the gel film creating step, the film-forming dope is casted into a film shape on the supporting base such as a glass plate, an aluminum foil, an endless stainless belt, or a stainless drum. Thereafter, on the supporting base, the film-forming dope is heated at 80° C. to 200° C., more preferably at 100° C. to 180° C. With this process, the chemical conversion agent and the imidization catalyst are activated, and partial curing and/or drying occurs. Thereafter, the resulting film is removed from the supporting base. A polyamic acid film (referred to as "gel film" hereinafter) is thus obtained.

This gel film has an intermediate state in the transition from a polyamic acid into polyimide, and has a self-supporting property. The content of volatile component in the gel film is preferably in a range of 5 to 500 weight %, more preferably in a range of 5 to 200 weight %, particularly preferably in a range of 5 to 150 weight %. The use of the film whose content of volatile component thus ranges provides an effect of preventing defects in the calcination step, such as film breakage, uneven coloring of film due to uneven drying, or uneven characteristics.

Note that, the content of volatile component of the gel film may be found by the following formula (1).

$$(A-B) \times 100/B \quad \text{(Formula 1)}$$

where A expresses a weight of the gel film, and B expresses a weight of the gel film after heated at 450° C. for 20 minutes (2-2. Calcination Step)

In the calcination step, the gel film is dried with its edge being fixedly held so that the film is not contracted by drying. Then, water, residual solvent, residual conversion agent and imidization catalyst are removed therefrom, and residual amic acid is completely immunized. The polyimide film according to the present invention is thus obtained.

The resulting film is preferably heated at 400 to 650° C. for 5 to 400 seconds.

A temperature and/or a heating time falling above these preferable ranges may cause a problem such as thermal deterioration of the film. On the contrary, a temperature and/or a heating time falling below these preferable ranges may not ensure the desired effect.

Further, to ease residual inner stress in the polyimide film, the tension required in transfer of the polyimide film may be decreased to a minimum level during the heating. This heating process may be performed in the calcination step, or as a separate step. The heating condition cannot be specified, as it varies depending on the characteristics of the polyimide film or the device adopted. However, the heating temperature is generally in a range not less than 200° C. and not more than 500° C., more preferably not less than 250° C. and not more than 500° C., particularly preferably not less than 300° C. and not more than 450° C. Further, the heating time is generally 1 to 300 seconds, more preferably 2 to 250 seconds, particularly preferably 5 to 200 seconds. A heating process under the foregoing condition eases the internal stress.

Further, in order to cancel the influence of tension or extension by lamination which occurs when the flexible metal clad laminate according to the present invention is finally processed by the thermal laminate method, the molecules of the polyimide film can be oriented to the carriage direction (MD direction). For example, the following means can be used to orient the polyimide film to the MD direction.

(1) Stretch the gel film in the MD direction.

(2) Introduce, as a part of the calcination step, a step of carrying the fixed gel film in which the tension in the axis direction (TD direction) is substantially cancelled.

"The tension in the axis direction (TD direction) of the gel film is substantially cancelled" designates a state where no tensile force by a mechanical handling is exerted in the TD direction except for the tension by the weight of the film.

<III. Adhesive Film According to the Present Invention>

The inventors of the present invention have created an adhesive film having the polyimide film as a core layer by providing an adhesion layer on at least one side of the polyimide film according to the present invention. The inventors of the present invention have also uniquely found that the use of the adhesive film eases thermal deformation of the film on the thermal laminate, and effectively prevents the dimensional change of the film. More specifically, the adhesive film according to the present invention is produced by providing an adhesion layer containing thermoplastic polyimide on at least one side of the polyimide film.

Suitable examples of thermoplastic polyimide contained in the adhesion layer include thermoplastic polyimide, thermoplastic polyamideimide, thermoplastic polyetherimide, and thermoplastic polyesterimide.

Further, to carry out laminate process by an existing device, and to maintain the heat-resistance of the resulting metal clad laminate, the thermoplastic polyimide according to the present invention preferably has a glass transition temperature (Tg) in a range of 150 to 300° C. Further, in consideration of solder resistance under the moisture absorption condition, Tg is preferably not less than 230° C., more preferably not less than 240° C. Note that, Tg can be found by a value of inflexion point of storage modulus measured by a dynamic viscoelasticity measurement apparatus (DMA).

The polyamic acid serving as a precursor of the thermoplastic polyimide is not particularly limited, and various kinds of publicly-known polyamic acid can be used. Also, the manufacturing thereof can be performed with any publicly-known materials or reaction conditions (see such as the later-described Example). Inorganic or organic fillers may be added as required.

Production of the adhesive film according to the present invention may adopt (1) a method of forming an adhesion layer on a polyimide film serving as a base film, or (2) a method of shaping an adhesion layer into a sheet, and bonding the sheet with the base film.

In the case of adopting the method (1), complete imidization of polyamic acid serving as a precursor of the thermoplastic polyimide contained in the adhesion layer may cause a decrease in solubility to the organic solvent. This may cause a difficulty in providing the adhesion layer on the base film (the polyimide film). In this view, it is more preferable to prepare the solution containing polyamic acid serving as a precursor of the thermoplastic polyimide, and applies the solution to the base film and carries out imidization. The imidization may be performed either by the thermal imidization method, or the chemical imidization method.

In either case, the temperature is preferably set to a range= (glass transition temperature of the thermoplastic polyimide− 100° C.) to (the glass transition temperature+200° C.), more preferably in a range=(glass transition temperature of the thermoplastic polyimide−50° C.) to (the glass transition temperature+150° C.) to ensure efficient progress of imidization. A higher temperature in thermal imidization facilitates imidization, and therefore imidization proceeds more rapidly. This increases the productivity.

However, if the thermal imidization temperature becomes excessively high, the thermoplastic polyimide may be decomposed by heat. On the other hand, if the temperature is excessively low, imidization does not proceed even in the chemical imidization method, and a longer time is needed for imidization.

The imidization time is not exclusively specified, and it is possible to take a sufficient time for ensuring substantial completion of imidization and drying. It is usually set to an appropriate time within a range of 1 to 600 seconds. Further, in order to improve fusion flowability of the adhesion layer, the imidization ratio may be decreased on purpose and/or some of the solvent may be remained.

The tension in the imidization is preferably set in a range of 1 kg/m to 15 kg/m, more preferably in a range of 5 kg/m to 10 kg/m. If the tension is smaller than the foregoing range, the film may not be sufficiently tightened on the way of carriage, and may not be taken up evenly. On the other hand, if the tension is greater than the foregoing range, the adhesive film is heated to a high temperature under a great tensile force, and a thermal stress may be caused in the adhesive film and the dimensional change may be induced even when a core film having a high tensile modulus, or a core film oriented to the MD direction is used.

The way of casting/applying the polyamic acid solution for forming the adhesion layer onto the base film is not particularly limited, and any existing technology, such as a die-coater, a reverse coater, or a blade coater may be adopted. The polyamic acid solution may include other materials such as fillers, as required.

The thicknesses of the respective layers of the adhesive film may be adjusted to appropriate values according to the usage. However, in order to suppress thermal deformation on the thermal laminate, the thermal expansion coefficient of the adhesive film at 200 to 300° C. is preferably set to a value close to the thermal expansion coefficient of the metal foil.

Specifically, the difference between the thermal expansion coefficient of the adhesive film and the thermal expansion coefficient of the metal foil is within ±10 ppm, more preferably within ±5 ppm.

Further, as required, the surface of the core film may be subjected to surface processing such as colona treatment, plasma treatment or coupling treatment before or after the provision of the adhesion layer.

<IV. Flexible Metal Clad Laminate of the Present Invention>

The flexible metal clad laminate according to the present invention is obtained by the later-described production method, by bonding an adhesive film with a metal foil. The metal foil is not particularly limited, but if the flexible metal clad laminate of the present invention is used for electronic devices or electric devices, a suitable example may be a foil formed of copper, copper alloy, stainless steel, stainless steel alloy, nickel, nickel alloy (including 42 alloy), aluminum, or aluminum alloy.

A general flexible metal clad laminate is often made of a rolled copper foil, or an electrolytic copper foil. These copper foils are also useful for the present invention. Note that, on the surface of the metal foil, a rust resistant layer, a heat-resistant layer or an adhesion layer may be applied.

In the present invention, the thickness of the metal foil is not particularly limited, but the thickness should be determined in consideration of assurance of desired function for its usage.

In the flexible metal clad laminate according to the present invention, it is highly preferable that the value of the ratio of dimensional change of the film before and after the heating at 250° C. for 30 minutes after the removal of metal foil falls, both in the MD direction and in the TD direction, within a range of −0.04 to +0.04. The dimensional change ratio before and after the heating can be found by a ratio of (i) the difference between the predetermined dimension of an etched flexible metal clad laminate and the predetermined dimension of a heated flexible metal clad laminate to (ii) the predetermined dimension of the flexible metal clad laminate before heating.

When the dimensional change ratio falls outside the range, the dimensional change of the flexible metal clad laminate at the time of component mounting increases, and therefore the components may not be properly placed at the desired position determined in the designing. This may cause inadequate connection between the components to be mounted and the base substrate. In other words, as long as the dimensional change ratio falls within the foregoing range, there will be no defects in component mounting.

The measurement method of the dimensional change ratio is not limited, and any publicly-known methods can be adopted as long as it is capable of measuring the dimensional change on the flexible metal clad laminate before and after etching or a heating process.

The dimensional change ratio is preferably measured for both of the MD direction and the TD direction. When imidization and lamination are continuously carried out, different tensions are exerted in the MD direction and TD direction, and their degrees of thermal expansion/contraction and dimensional change ratios differ.

Therefore, in a material causing a small ratio of dimensional change, the dimensional change ratios of the MD direction and in the TD direction are both required to be small. In the present invention, it is highly preferable that the gross value of the ratios of dimensional change of the film before and after the heating at 250° C. for 30 minutes after the removal of metal foil falls, both in the MD direction and in the TD direction, within a range of −0.04 to +0.04.

Further, the polyimide film used as the core layer of the adhesive film according to the present invention is given a property for effectively easing the thermal stress, as described above. Therefore, even when the adhesive film of the present invention has a thickness of equal to or less than 15-µm with which the film is more susceptible to thermal stress, the dimensional change ratio of the resulting flexible metal clad laminate can be reduced. More specifically, it is preferable that the gross value of the ratios of dimensional change of the film before and after the heating at 250° C. for 30 minutes after the removal of metal foil falls, both in the MD direction and in the TD direction, within a range of −0.05 to +0.05.

Note that, in the heating process for measuring the dimensional change ratio, the condition is not particularly specified as long as the process is carried out under the temperature of 250° C. for 30 minutes.

<V. Production Method of Flexible Metal Clad Laminate>

The following describes a production method for the flexible metal clad laminate according to the present invention. The production of the flexible metal clad laminate of the present invention is however not limited to this method.

The production method for the flexible metal clad laminate according to the present invention preferably includes a step of bonding a metal foil with the descried adhesive film.

The bond of the adhesive film and the metal foil may be performed by a thermal roll laminate apparatus having at least a single pair of metal rolls, or by a continuous process with a double belt press (DBP). Among them, the thermal roll laminate apparatus having at least a single pair of metal rolls is particularly preferable because of its simple device structure, which does not require much maintenance cost.

Further, in the case of bonding the adhesive film and the metal foil by the thermal roll laminate apparatus having at least a single pair of metal rolls, the dimensional change may more easily occur. Therefore, the adhesive film and the polyimide film according to the present invention become significantly effective when they are bonded by the thermal roll laminate apparatus.

"The thermal roll laminate apparatus having at least a single pair of metal rolls" may be any device having metal rolls for applying heat and pressure to the material. The present invention does not limit the structure of the device.

Note that, the step of bonding the adhesive film with the metal foil by thermal laminate is hereinafter referred to as a "thermal laminate step".

The structure of means for performing thermal laminate (hereinafter also referred to as "thermal laminate means") is not particularly specified, but it preferably disposes a protection material between the surface to which pressure is applied and the metal foil to ensure desirable exterior of the resulting laminate.

The protection material is selected from a group of materials durable to the heating temperature in the thermal laminate step, for example, heat-resistant plastic such as a non-thermoplastic polyimide film, or a metal foil such as a copper foil, an aluminum foil, or a SUS foil. Among them, in consideration of balance of desired levels of characteristics including heat-resistance and reusability, a particularly preferable film is one made of a non-thermoplastic polyimide film or thermoplastic polyimide whose glass transition temperature (Tg) is at least 50° C. higher than that of the laminate temperature. In the case of using thermoplastic polyimide, the foregoing conditions should be met to avoid adhesion onto the rolls.

Further, if the protection material is thin, the effects of protection and buffering at the lamination cannot be ensured. In this view, the thickness of the non-thermoplastic polyimide film is preferably not less than 75 μm.

Further, the protection material is not always formed as a single layer. For example, the protection material may have plural layers of different characteristics.

Further, if an unprocessed protection material is subjected directly to high-temperature lamination, the exterior or dimensional stability of the resulting flexible metal clad laminate may not be fully ensured because of rapid thermal expansion of the protection material. Therefore, the protection material is preferably subjected to pre-heating before the lamination. By thus subjecting the protection material to pre-heating before the lamination, the protection material undergoes thermal expansion in advance, and therefore the influence to the exterior or dimensional stability of the resulting flexible metal clad laminate is suppressed.

The pre-heating may be performed by a method of bringing the protection material into contact with the heating roll, for example, by holding the protection material by the heating roll. The contact time is preferably not less than 1 second, more preferably not less than 3 seconds. If the contact time is shorter than the foregoing range, the lamination is carried out before the protection material completely undergoes thermal expansion. As a result, the protection material causes rapid thermal expansion during the lamination. This may degrades the exterior or dimensional stability of the resulting flexible metal clad laminate. The length of this holding of the protection material by the heating roll is not particularly limited, and may be determined in consideration of the diameter of the heating roll and the contact time.

The way of heating the lamination material by the thermal laminate means is not particularly limited, and can be performed by any heating means applying a conventionally-known heating mode using a predetermined temperature such as a heat-circulation mode, a hot-air heating mode, or an induction heating mode. Similarly, the way of pressure application to the lamination material by the thermal laminate means is also not particularly limited, and can be performed by any pressure application means applying a conventionally-known pressure application mode using a predetermined pressure such as a hydraulic mode, an air-pressure mode, or a gap pressure mode.

The heating temperature in the thermal laminate step, i.e. the laminate temperature is preferably not less than the glass transition temperature (Tg) of the adhesive film+50° C., more preferably not less than the Tg of adhesive film+100° C. With the temperature not less than Tg of the adhesive film+50° C., it is possible to appropriately laminate the adhesive film and the metal foil in a thermal manner. With the temperature not less than Tg of the adhesive film+100° C., the laminate speed increases, thereby increasing productivity.

Particularly, the polyimide film serving as the core of the adhesive film according to the present invention is designed to ensure the effect of ease of thermal stress in the lamination at a temperature equal to or greater than Tg+100° C. Therefore, it becomes possible to produce flexible metal clad laminates with desirable dimensional evenness and productivity.

The following explains a mechanism of easing the thermal stress upon thermal laminate.

When the adhesion layer of the adhesive film contains thermoplastic polyimide, the laminate temperature inevitably increases, and the temperature of the flexible metal clad laminate immediately after the laminate process is also very high. At this time, if the storage modulus of the core layer of the adhesive film falls below a certain range, not only the adhesion layer but also the entire adhesive film are softened (the self-supporting property is however kept). As a result, the thermal stress accumulated in the laminate due to tension or pressure on thermal laminate is relieved.

To more effectively ease thermal stress, it is preferable to reduce the tension exerted onto the laminate as much as possible. In this view, the flexible metal clad laminate immediately after the laminate process is preferably treated as follows. First, with the protection material thereon, the flexible metal clad laminate immediately after the laminate process is brought into contact with a heating roll by, for example, holding the plate by the heating roll. In this way, the residual strain of the plate generated in the thermal laminate is relieved under the condition prevents the influence to the tensile force, before releasing it from the heating roll.

The contact time of the plate and the heating roll is preferably not less than 0.1 seconds, more preferably not less than 0.2 seconds, particularly preferably not less than 0.5 seconds. If the contact time is less than the foregoing range, the diminishing effect may not be fully ensured. The upper limit of the contact time is preferably not more than 5 seconds. The contact of more than 5 seconds is not preferred because the effect will be the same, and it causes a decrease in laminate speed and limits line layout.

Further, even with a slow cooling process after the lamination by being in contact with the heating roll, the temperature of the flexible metal clad laminate still greatly differs from room temperature, and the residual strain may not be sufficiently relieved. Therefore, the flexible metal clad laminate after the slow cooling process by being in contact with the heating roll is preferably subjected to post-heating together with the protection material. The tensile force at this time is preferably in a range of 1 to 10 N/cm. Further, the atmosphere temperature in the post-heating is preferably in a range of: (laminate temperature−200° C.) to (laminate temperature+100° C.).

The "atmosphere temperature" designates an external surface temperature of the protection material adhered to both sides of the flexible metal clad laminate. The actual temperature of the flexible metal clad laminate slightly varies depending on the thickness of the protection material, but the effect of the post-heating is ensured by keeping the temperature of the surface of the protection material within the foregoing range. The temperature of the surface of the protection material may be measured by a thermocouple or a thermometer.

The laminate speed in the thermal laminate step is preferably not less than 0.5 m/min, more preferably not less than 1.0 m/min. If the laminate speed is equal to or more than 0.5 m/min, it is possible to carry out desirable thermal laminate. If the 1.0 m/min is equal to or more than 1.0 m/min, the productivity further increases.

As to the pressure in the thermal laminate step, that is, the laminate pressure, a greater pressure allows to decrease the laminate temperature, and increase laminate speed. Generally speaking, an excessively high laminate pressure tends to increase dimensional change of the resulting laminate. On the other hand, if the laminate pressure is excessively low, the adhesion strength of the metal foil of the resulting laminate decreases. In view of this, the laminate pressure is preferably in a range of 49 to 490 N/cm (5 to 50 kgf/cm), more preferably in a range of 98 to 294 N/cm (10 to 30 kgf/cm). With a laminate pressure in this range, it becomes possible to set all of laminate temperature, laminate speed, and laminate pressure to desirable values, and productivity further increases.

The tensile force of the adhesive film in the laminate process is preferably in a range of 0.01 to 4 N/cm, more preferably in a range of 0.02 to 2.5 N/cm, particularly preferably in a range of 0.05 to 1.5 N/cm. If the tensile force falls below the foregoing range, the lamination layer may become too loose or wind on the way of carriage, and therefore not evenly transferred to the heating roll, and the desirable appearance of the flexible metal clad laminate is not ensured. On the other hand, if the tensile force falls above the foregoing range, the influence of the tensile force becomes so intense that it cannot be relieved by the controls of storage modulus and Tg of the adhesion layer, and dimensional evenness may decrease.

To produce the flexible metal clad laminate according to the present invention, a thermal laminate apparatus is preferably used. The thermal laminate apparatus sequentially heat and bond lamination material by pressure. In this thermal laminate apparatus, lamination material unrolling means for unrolling a lamination material may be provided at a preceding stage of the thermal laminate means, or lamination material take-up means for taking up the lamination material at a following stage of the thermal laminate means. Provision of these means further improves productivity of the thermal laminate apparatus.

The structures of the lamination material unrolling means and lamination material take-up means are not particularly limited, and a conventionally-known roll-type take-up device capable of taking up an adhesive film, metal foil, or the resulting laminate may be used.

Further preferably, the thermal laminate apparatus includes protection material take-up means for taking up the protection material or protection material unrolling means unrolling the protection material. With the protection material take-up means and the protection material unrolling means, the used protection material can be taken up again and supplied into the unreeling section in the laminate step. This allows reuse of the protection material.

Further, the thermal laminate apparatus includes end portion detecting means and take-up portion correcting means so as to align the both ends of the protection material in taking up the protection material. With this provision, the protection material can be taken up accurately with the both ends aligned, and reuse efficiency of the protection material increases. Note that, the structures of the protection material take-up means, the protection material unrolling means, the end portion detecting means and the take-up portion correcting means are not particularly limited, and they may be realized by any conventionally-known devices.

<VI. Usage of the Present Invention>

As described, by thus forming a desired pattern wire through etching of a metal foil, the flexible metal clad laminate produced by the production method according to the present invention becomes useful for various kinds of flexible wire board containing miniaturized components at high density. The usage of the present invention is of course not limited to this, and the present invention is useful for any kinds of lamination containing a metal foil.

Note that, the present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

The following more specifically explains the present invention with concrete examples. The present invention is however not limited to the description of the embodiments below. A person in the art is allowed to modify the embodiments in many ways within the technical scope of the claims. The following specifies the evaluation methods used in Synthesis Example, Example and Comparative Example, for evaluating glass transition temperature of thermoplastic polyimide; storage modulus, tensile modulus, moisture-absorption expansion coefficient, and linear expansion coefficient of polyimide film; dimensional change ratio, metal foil peel-strength, and solder resistance under the moisture absorption condition of flexible metal clad laminate.

[Glass Transition Temperature]

The glass transition temperature is measured by DMS6100 (SII nano technology Inc.), inflexion point of storage modulus is used as the glass transition temperature.

Sample measurement range; width=9 mm, Interval between chucks=20 mm

Temperature measurement range; 0 to 440° C.
Temperature increasing speed; 3° C./min
Strain amplitude; 10 μm
Measurement frequency; 1.5, 10 Hz
Minimum tensile force/compressive force; 100 mN
Tensile force/compression gain; 1.5
Dynamic amplitude default value; 100 mN

[Storage Modulus of Core Film]

The storage modulus was measured by the same measurement device and condition for the glass transition temperature. The MD direction of the core film was subjected to the measurement.

[Tensile Modulus]

The tensile modulus was measured in accordance with ASTM D882. The MD direction of the core film was subjected to the measurement.

Sample measurement range; width=15 mm, interval between chucks=100 mm

Tensile speed; 200 mm/min

[Moisture-Absorption Expansion Coefficient]

Moisture-absorption expansion coefficient was calculated according to a change amount measured by a vapor atmosphere heat mechanical analysis device TMA/HUM-1 (product of Rigaku Corporation). The measurement was carried out at 45° with respect to the molecular orientation axis of the core film.

Sample measurement range; width=5 mm, interval between chucks=15 mm

Measurement temperature; 50° C.
Temperature/humidity condition; held at 40% R.H. for three hours and at 80% R.H. for another three hours

[Linear Expansion Coefficient]

The linear expansion coefficient of the polyimide film was measured as follows. The temperature of the film was increased from 0° C. to 460° C. by a thermo mechanical analysis device (product name: TMA/SS6100; SII nano technology Inc.), dropped again to 10° C., and then increased at 10° C./min. Then the mean value of temperatures in the range of 100 to 200° C. in the second increasing process was found. The MD direction and the TD direction of the core film was subjected to the measurement.

Sample shape; width=3 mm, length=10 mm
Load; 29.4 mN
Temperature measurement range; 0 to 460° C.
Temperature increasing speed; 10° C./min

[Dimension Change Ratio]

According to JIS C6481, four holes were made on a flexible laminate, and the interval between the holes were measured. Next, after the metal foil was removed from the flexible laminate through etching, the plate was allowed to stand for 24 hours in a temperature-controlled room at 20° C., 60% R.H. After that, as with the process before etching, the intervals between the holes were measured again. Then, the dimensional change ratio of the flexible laminate before and after the etching of metal foil was calculated by the following formula, dimensional change ratio(%)={(D2−D1)/D1}×100 where D1 expresses a measured interval between the holes before the removal of metal foil, and D2 expresses a measured interval between the holes after the removal of metal foil.

Next, after the measured sample having been through the etching was heated at 250° C. for 30 minutes, the plate was allowed to stand for 24 hours in a temperature-controlled room at 20° C., 60% R.H. After that, as with the process before etching, the intervals between the holes were measured again. Then, the dimensional change ratio of the flexible laminate before and after the heating was calculated by the following formula, dimensional change ratio(%)={(D3×D2)/D2}×100 where D3 expresses a measured interval between the holes after the heating.

The MD direction and the TD direction of the core film were both subjected to the measurement.

[Peel-Strength of Metal Foil: Adhesive Strength]

A sample was prepared according to "6.5 peel-strength" of JIS C6471, and the metal foil portion 5 mm in width was peeled at 50 mm/min, 180 degree peeling angle. The load of the peeled metal foil portion was measured.

[Solder Resistance of Flexible Metal Clad Laminate]

After a sample was prepared according to JIS C6471, and solder resistance of the sample prepared under normal condition (20° C., 60% RH, 24 hours after preparation) and moisture absorption condition (85° C., 85% RH, 96 hours after preparation), and apparent whitening and delamination were examined. The samples were dipped in a solder bath at 300° C. for a minute to evaluate a normal solder, and at 260° C. for 10 seconds to evaluate a moisture absorption solder. A sample which caused no change in appearance before and after the solder dipping was evaluated as O, and a sample which caused either of removal of metal foil layer, bleach of adhesive film, or expansion was evaluated as x.

Synthesis Example 1

Synthesis of Thermoplastic Polyimide Precursor 780 g of N,N-dimethylformamide (also referred to as "DMF", hereinafter) and 115.6 g of BAPP was fed into a 2000-ml glass flask. Then, 78.7 g of a 3,3',4,4'-biphenyltetracarboxylic acid dianhydride (also referred to as "BPDA", hereinafter) was fed by degrees into the mixture while the mixture was stirred under nitrogen atmosphere. Then, 3.8 g of a 3,3',4,4'-ethyleneglycol dibenzoate tetracarboxylic acid dianhydride (also referred to as "TMEG", hereinafter) was added to the mixture, and stirred for 30 minutes on ice bath. Aside from this, a solution in which 2.0 g of TMEG was dissolved to 20 g of DMF was prepared, and added by degrees to the foregoing reaction solution. With the addition of the solution, the solution was stirred while watching for the viscosity. The addition/stirring was stopped when the viscosity became 3000 poise (300 Pa·s). A polyamic acid solution was thus prepared.

The produced polyamic acid solution was casted onto a 25-µm PET film (Cerapeel HP; product of Toyo metallizing Co. Ltd.) so that the resulting layer becomes 20 µm thick, and then dried for 5 minutes at 120° C. The dried self-supporting film was removed from the PET, and fixed to a metal pin frame, and further dried at 150° C. for 5 minutes, at 200° C. for another 5 minutes, at 250° C. for another 5 minutes, and at 350° C. for another 5 minutes. Then the glass transition temperature of the resulting monolayer sheet was measured, with the result of 240° C.

Examples 1 to 4

Synthesis of Polyimide Film 4,4'-diaminodiphenylether (also referred to as "4,4'-ODA", hereinafter) and BAPP were added to DMF at mole ratios shown in Table 1 in a reaction system kept at 5° C., and stirred. After visually confirming the dissolution, s 3,3', 4,4'-benzophenone tetracarboxylic acid dianhydride (also referred to as "BTDA", hereinafter), and stirred for 30 minutes.

TABLE 1

|  | 4,4'-ODA | BAPP | BTDA | PMDA (First) | p-PDA | PMDA (Second) |
| --- | --- | --- | --- | --- | --- | --- |
| Example 1 | 20 | 30 | 25 | 20 | 50 | 52 |
| Example 2 | 20 | 30 | 30 | 15 | 50 | 52 |
| Example 3 | 10 | 40 | 20 | 25 | 50 | 52 |
| Example 4 | 10 | 40 | 25 | 20 | 50 | 52 |

Next, a pyromellitic acid dianhydride (also referred to as "PMDA", hereinafter) was added at a mole ratio shown in "PMDA (First)" of Table 1, stirred for 30 minutes, so as to form thermoplastic polyimide precursor block component. Then, p-phenylenediamine (also referred to as "p-PDA", hereinafter) was added at a mole ratio shown in Table 1. After dissolving the p-phenylenediamine, PMDA was added again at a mole ratio shown in "PMDA (Second)" of Table 1, and stirred for 30 minutes.

Finally, a solution in which 3 mol % PMDA is dissolved to DMF at a solid content concentration of 7% was prepared. While avoiding excessive increase in viscosity, the solution was added by degrees into the reaction solution. When the viscosity at 20° C. becomes 4000 poise (400 Pa·s), polymerization was completed.

An imidization accelerator agent made of acetic acid anhydride/isoquinoline/DMF (weight ratio 2.0/0.3/4.0) was added to the polyamic acid solution at a weight ratio of 45% with respect to the polyamic acid solution. The resulting solution was stirred continuously by a mixer, and extruded from a T-die to be casted onto a stainless endless belt running 20 mm below the die. After heating this resin film at 130° C.×100 seconds, the self-supporting gel film was peeled off the endless belt (content of volatile component=30 weight %) and fixed to a tenterclip, and dried and imidized at 300° C. for 30 seconds, at 400° C. for 30 seconds, at 500° C. for 30 seconds. A 18-μm thick polyimide film was thus obtained.

This polyimide film was non-thermoplastic. Meanwhile, 7 weight % PMDA DMF solution was added by degrees into the prepolymer resulted from the first addition of PMDA and stirring. The solution was stirred until it has a viscosity of 3000 poise so as to produce a polyamic acid solution. The produced polyamic acid solution was casted onto a 25-μm PET film (Cerapeel HP; product of Toyo metallizing Co. Ltd.) so that the resulting layer becomes 20 μm thick, and then dried for 5 minutes at 120° C. The dried self-supporting film was removed from the PET, and fixed to a metal pin frame, and further dried at 200° C. for 5 minutes, at 250° C. for another 5 minutes, and at 300° C. for another 5 minutes. The plasticity of this polyimide film was examined. The film was thermoplastic.

Note that, in Example 1, generation of a 10000 m film took 20 hours after the beginning of polymerization.

Examples 5 to 8

Production of Polyimide Film

An imidization accelerator agent containing acetic acid anhydride/isoquinoline/DMF (weight ratio 2.0/0.3/4.0) was added to the polyamic acid solution produced by the same method used in Examples 1 to 4 at a weight ratio of 45%. The resulting solution was stirred continuously by a mixer, and extruded from a T-die to be casted onto a stainless endless belt running 20 mm below the die. After heating this resin film at 130° C.×100 seconds, the self-supporting gel film was peeled off the endless belt (content of volatile component=30 weight %) and fixed to a tenterclip, and dried and imidized at 300° C. for 22 seconds, at 400° C. for 22 seconds, at 500° C. for 22 seconds. A 10-μm thick polyimide film was thus obtained.

Examples 9 to 16

Production of Flexible Metal Clad Laminate

The thermoplastic polyimide precursor according to Synthesis Example 1 was applied onto the both surfaces of the polyimide film according to Examples 1 to 8 by a gravure coater so that one side of the resulting thermoplastic polyimide layer (adhesion layer) has a thickness of 3.5 μm in the case of the polyimide films of Examples 1 to 4, or so that one side of the resulting thermoplastic polyimide layer (adhesion layer) has a thickness of 2 μm in the case of the polyimide films of Examples 5 to 8. The film was heated by being passed through a drying oven set to 160° C. for a minute.

Next, the film was subjected to thermal imidization by being passed through a far-infrared heating oven set to 390° C. for 20 seconds. As a result, an adhesive film was obtained.

18-μm rolled copper foils (BHY-22B-T, Japan Energy Corporation) were placed on the both surfaces of the resulting adhesive film, and protection materials (Apical 125NPI; Kaneka Corporation) were placed on the copper foils, and this lamination was continuously subjected to thermal laminate on condition that tensile force of the polyimide film=0.4N/cm, laminate temperature=380° C., laminate pressure=196 N/cm(20 kgf/cm), and laminate speed 1.5 m min. The flexible metal clad laminate according to the present invention was thus completed.

Note that, the protection materials were through pre-heating by contacting to the heating roll for three seconds by being contiguously held by the heating roll, before they were placed on the outer faces of the copper foils to be laminated thereon. Further, after the lamination process, the lamination coated with the protection material was brought into contact with the heating roll for 0.2 seconds. After the lamination was naturally cooled, the protection materials were peeled off.

Comparative Example 1

After the polyamic acid solution according to Synthesis Example 1 was diluted by DMF until its solid content became 10 weight %, and the resulting solution was applied onto the both surfaces of the 18-μm thick polyimide film (Apical 18HPP, Kaneka Corporation) by a gravure coater so that one side of the resulting film has a thickness of 3.5 μm. The film was heated by being passed through a drying oven set to 140° C. for a minute.

Next, the film was subjected to thermal imidization by being passed through a far-infrared heating oven set to 390° C. for 20 seconds. 18-μm rolled copper foils (BHY-22B-T, Japan Energy Corporation) were placed on the both surfaces of the resulting adhesive film, and protection materials (Apical 125NPI; Kaneka Corporation) were placed on the copper foils, and this lamination was continuously subjected to thermal laminate on condition that tensile force of the polyimide film=0.4 N/cm, laminate temperature=380° C., laminate pressure=196 N/cm (20 kgf/cm), and laminate speed 1.5 m/min. The flexible metal clad laminate according to the present invention was thus completed.

Comparative Example 2

A flexible metal clad laminate was produced by the same process as that of Comparative Example 1 except that the core film was made of a 10-μm thick polyimide film (Apical 10HPP, Kaneka Corporation), and the coating was adjusted to have a thickness of 2 μm for each side.

Comparative Example 3

A flexible metal clad laminate was produced by the same process as that of Comparative Example 1 except that the core film was made of a 20-μm thick polyimide film (Apical 20NPP, Kaneka Corporation), and the coating was adjusted to have a thickness of 2 μm for each side.

Comparative Example 4

A flexible metal clad laminate was produced by the same process as that of Comparative Example 1 except that the core film was made of a 12.5-μm thick polyimide film (Apical 12.5NPP, Kaneka Corporation), and the coating was adjusted to have a thickness of 1.5 μm for each side.

Tables 2 and 3 show evaluation results of characteristics of the polyimide films and flexible metal clad laminates according to the foregoing Examples and Comparative Examples.

TABLE 2

| | inflexion point of storage modulus (°C.) | storage modulus at 380° C. (GPa) | Tanδ peak-top (°C.) | $\{(\alpha_1 - \alpha_2)/\alpha_1\} \times 100$ | tensile modulus (GPa) | moisture-absorption expansion coefficient (ppm/% R.H.) | linear expansion coefficient (ppm/°C.) MD | linear expansion coefficient (ppm/°C.) TD |
|---|---|---|---|---|---|---|---|---|
| Example 1 | 298 | 1.04 | 348 | 80 | 6.5 | 12.5 | 11.6 | 11.9 |
| Example 2 | 290 | 0.88 | 331 | 80 | 6.7 | 11.5 | 12.4 | 11.9 |
| Example 3 | 295 | 0.80 | 344 | 83 | 6.3 | 12.4 | 12.2 | 12.1 |
| Example 4 | 287 | 0.77 | 335 | 85 | 6.4 | 10.5 | 11.5 | 11.7 |
| Example 5 | 299 | 1.00 | 346 | 79 | 6.3 | 12.1 | 11.7 | 11.9 |
| Example 6 | 290 | 0.86 | 333 | 81 | 6.7 | 11.2 | 12.3 | 12.0 |
| Example 7 | 294 | 0.77 | 344 | 82 | 6.2 | 12.6 | 12.5 | 12.6 |
| Example 8 | 287 | 0.77 | 335 | 85 | 6.2 | 10.0 | 11.6 | 11.8 |
| Comparative Example 1 | 278 | 0.6 | 310 | 77 | 6.0 | 7.8 | 12.4 | 12.0 |
| Comparative Example 2 | 280 | 0.8 | 308 | 70 | 5.8 | 7.5 | 11.6 | 11.0 |
| Comparative Example 3 | — | 2.7 | — | — | 4.4 | 15.5 | 16.4 | 15.5 |
| Comparative Example 4 | — | 2.4 | — | — | 4.2 | 15.0 | 16.6 | 15.8 |
| Reference Example 1 | 280 | 1.10 | 335 | 82 | 7.2 | 12.0 | 10.5 | 10.4 |

※·$\alpha_1$; inflexion point of storage modulus (GPa)
※·$\alpha_2$; storage modulus at 380° C. (GPa)
※·properties of core film used as an adhesive film in Comparative Examples

TABLE 3

| | Dimension change after etching (%) MD | Dimension change after etching (%) TD | Dimension change after heating (%) MD | Dimension change after heating (%) TD | Adhesion strength (N/cm) | Solder resistance normal | Solder resistance moisture-absorbed |
|---|---|---|---|---|---|---|---|
| Example 9 | −0.03 | +0.03 | −0.03 | +0.04 | 13.5 | ○ | ○ |
| Example 10 | −0.03 | +0.03 | −0.03 | +0.03 | 13.0 | ○ | ○ |
| Example 11 | −0.04 | +0.04 | −0.04 | +0.03 | 12.5 | ○ | ○ |
| Example 12 | −0.03 | +0.04 | −0.04 | +0.04 | 13.0 | ○ | ○ |
| Example 13 | −0.03 | +0.04 | −0.04 | +0.04 | 12.0 | ○ | ○ |
| Example 14 | −0.03 | +0.03 | −0.04 | +0.03 | 12.6 | ○ | ○ |
| Example 15 | −0.03 | +0.04 | −0.04 | +0.04 | 11.8 | ○ | ○ |
| Example 16 | −0.04 | +0.03 | −0.04 | +0.05 | 12.5 | ○ | ○ |
| C Example 1 | −0.03 | +0.04 | −0.10 | +0.06 | 9.0 | ○ | ○ |
| C Example 2 | −0.04 | +0.09 | −0.13 | +0.13 | 8.5 | ○ | ○ |
| C Example 3 | −0.20 | +0.25 | −0.17 | +0.20 | 12.5 | ○ | x |
| C Example 4 | −0.23 | +0.30 | −0.22 | +0.25 | 10.8 | ○ | x |

* C Example . . . Comparative Example

As shown in Comparative Examples 1 to 4, in the case where the storage modulus of core film and the tan δ peak fall outside the predetermined ranges, the stress exerted to the material in the thermal laminate process cannot be efficiently diminished, and the dimensional change ratio increased. The dimensional change ratio particularly increases as the thickness of the adhesive film decreases.

Meanwhile, in Examples 9 to 16 which use a core film having characteristics all fall within the predetermined ranges, the dimensional change was suppressed even in production using a thermal laminate method. Particularly, in Examples 13 to 16 which use a thin adhesive film, the dimensional change ratios were substantially the same as those of Examples 9 to 12. Further, control in storage modulus does not affect the adhesive strength or the solder resistance, and causes no defect in practical use.

Reference Example 1

A 18-μm thick polyimide film was produced by the same process as that of Example 1 except that 3,4'-diaminodiphenylether (also referred to as "3,4'-ODA", hereinafter) was used instead of 4,4'-ODA, in the polyamic acid polymerization process. Note that, in Reference Example 1, generation of a 10000-m film took 25 hours after the beginning of polymerization.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

As described, the polyimide film according to the present invention is suppressed a dimensional change of a flexible metal clad laminate during the manufacturing of the flexible metal clad laminate. Therefore, it becomes possible to suppress dimensional change of the laminate due to heat in the various treatment processes even when the laminate is produced by a thermal roll laminate method.

The present invention is therefore applicable to a field of manufacturing resin molded products such as lamination plates or adhesive films containing polyimide. In addition to this usage, the present invention is also useful for a field related to manufacturing of electronic components using the adhesive films or lamination plates.

The invention claimed is:

1. A polyimide film produced by imidizing polyamic acid produced by reacting aromatic diamine containing 4,4'-diaminodiphenylether, and an aromatic acid dianhydride, said polyimide film satisfies all of the following conditions (A) to (D), (A) an inflexion point of storage modulus ranges from 270° C. to 340° C.;

(B) tan δ, which is a value obtained by dividing a loss elastic modulus by a storage modulus, has a peak-top in a range of 320° C. to 410° C.;

(C) a storage modulus at 380° C. ranges from 0.4 GPa to 2.0 GPa; and (D) a storage modulus $\alpha 1$ at the inflexion point (GPa) and a storage modulus $\alpha 2$ at 380° C. (GPa) satisfy: $85 \geq \{(\alpha 1 - \alpha 2)/\alpha 1\} \times 100 \geq 65$, wherein the polyimide film is produced using 4,4'-diaminodiphenylether in an amount of not less than 10 mol % and not more than 50 mol % with respect to an entire diamine component, and wherein measurement for the storage modulus, the inflection point of the storage modulus, the peak top of tan δ, and the storage modulus at 380° C. is carried out at a frequency of 5 Hz.

2. The polyimide film as set forth in claim 1 wherein the polyimide film is produced by imidization of a polyamic acid solution, which is prepared by the following steps (a) to (c), (a) reacting an aromatic acid dianhydride, and an excess molar quantity of aromatic diamine compound in an organic polar solvent, so as to produce a prepolymer having an amino group at each terminus;

(b) subsequently adding an aromatic diamine compound into the reaction solution; and (c) adding extra aromatic acid dianhydride so that molar amounts of the aromatic acid dianhydride and the aromatic diamine in a whole process become substantially equal.

3. The polyimide film as set forth in claim 1 wherein a tensile modulus of the polyimide film is not less than 6.0 GPa and not more than 10 GPa.

4. The polyimide film as set forth in claim 1 wherein a moisture-absorption expansion coefficient of the polyimide film after the polyimide is kept at 50° C., 40% R.H. for three hours and 80% R.H. for another three hours is not more than 13 ppm/% R.H.

5. The polyimide film as set forth in claim 1 wherein a linear expansion coefficient of the polyimide film at 100° C. to 200° C. is not less than 5 ppm/° C. and not more than 15 ppm/° C.

6. An adhesive film formed by providing an adhesion layer containing thermoplastic polyimide on at least on one side of the polyimide film set forth in claim 1.

7. The adhesive film as set forth in claim 6 wherein a glass transition temperature (Tg) of the thermoplastic polyimide is not less than 230° C.

8. The adhesive film as set forth in claim 6 wherein a thickness of the adhesive film is not more than 15 μm.

9. A flexible metal clad laminate formed by bonding the adhesive film as set forth claim 6 with a metal foil.

10. The flexible metal clad laminate as set forth in claim 9 wherein the flexible metal clad laminate is formed by bonding the adhesive film with a metal foil using a thermal roll laminate apparatus having at least a single pair of metal rolls.

11. The flexible metal clad laminate as set forth in claim 10 wherein the flexible metal clad laminate is formed by a laminate process in which the adhesive film is bonded with a metal foil by the thermal roll laminate apparatus having at least a single pair of metal rolls, using a protection material provided between the metal foil and the rolls, and separating the protection material "after a resulting lamination" is cooled, the protection material being made of non-thermoplastic polyimide or thermoplastic polyimide whose glass transition temperature (Tg) is at least 50° C. higher than a laminate temperature.

12. The flexible metal clad laminate as set forth in claim 11 wherein, before the protection material is removed after the laminate process, the lamination in which the protection material and the flexible metal clad laminate are bonded together is brought into contact with a heating roll for 0.1 to 5 seconds, and the protection material is removed after the lamination is cooled.

13. The flexible metal clad laminate as set forth in claim 9 wherein a dimensional change ratio of the flexible metal clad laminate before and after 30 minutes heating at 250° C. after the removal of metal foil ranges from −0.04 to +0.04% both in a MD direction and in a TD direction.

14. The flexible metal clad laminate as set forth in claim 9 wherein the adhesive film has a thickness of not more than 15 μm, and the dimensional change ratio of the flexible metal clad laminate before and after 30 minutes heating at 250° C. after the removal of metal foil ranges from −0.05 to +0.05% both in a MD direction and in a TD direction.

* * * * *